United States Patent [19]

Yamauchi

[11] Patent Number: 5,642,314

[45] Date of Patent: Jun. 24, 1997

[54] SEMICONDUCTOR INTEGRATED CIRCUIT

[75] Inventor: Hiroyuki Yamauchi, Osaka, Japan

[73] Assignee: Matsushita Electric Industrial Co., Ltd., Osaka, Japan

[21] Appl. No.: 706,196

[22] Filed: Aug. 30, 1996

Related U.S. Application Data

[63] Continuation of Ser. No. 366,113, Dec. 29, 1994, abandoned.

[30] Foreign Application Priority Data

Dec. 29, 1993 [JP] Japan ..................... 5-351187

[51] Int. Cl.$^6$ ............................................. G11C 7/00
[52] U.S. Cl. .................. 365/189.06; 365/203; 365/205; 365/207
[58] Field of Search .............................. 365/189.06, 203, 365/207, 226, 149, 205

[56] References Cited

U.S. PATENT DOCUMENTS 5,091,886  2/1992  Miyawaki et al. ............... 365/189.06
5,369,613  11/1994 Matsui ............................. 365/189.06

*Primary Examiner*—David C. Nelms
*Assistant Examiner*—Huan Hoang
*Attorney, Agent, or Firm*—McDermott, Will & Emery

[57] ABSTRACT

A second power supply line is connected to a first power supply line via an N-MOS transistor and has a second potential (Vcc–Vt). The second power supply line is grounded to a ground line via one of P-MOS transistors of a clamp circuit, one of N-MOS transistors of a decode switch, an N-MOS sense amplifier, and a common source line of sense amplifiers. Accordingly, even when a power supply potential negatively bumps, a ground potential flows from the second power supply line through a current path thus formed, and the potential of the second power supply line can follow the negative bump. Since the transistors forming the clamp circuit are of the P-MOS type, the data lines are electrically connected to the second power supply line, so that the data lines can follow the negative bump of the first power supply line. Accordingly, it is possible to provide a data line precharging system which can follow the negative bump of the power supply without deteriorating the sensitivity of the amplifier of the voltage detecting type.

15 Claims, 14 Drawing Sheets

# 5,642,314

SEMICONDUCTOR INTEGRATED CIRCUIT

This is a continuation application of application Ser. No. 08/366,113, filed Dec. 29, 1994 now abandoned.

BACKGROUND OF THE INVENTION

The present invention relates to a semiconductor integrated circuit, and in particular to an improvement of a construction of a data line precharge power supply when data is transferred from memory cells to an output circuit on a semiconductor chip. The improvement can be effectively used in a dynamic random access memory (which will be referred to as "DRAM") and a static random access memory (which will be referred to as "SRAM").

Two kinds of precharge power supply systems for data lines have been proposed for SRAMs which use a data line amplifier formed of a differential amplifier of the current mirror type in order to increase an operation speed in many cases.

One of them is disclosed in "1985 ISSCC Technical Digest", p. 65, FIG. 1. This system uses N-MOS transistors and a power supply generating a potential Vcc for precharging the data lines.

A DRAM to which the above technique is applied will be described below as a first prior art with reference to FIG. 11. Prior to description of a function of a precharge circuit in the DRAM, general description will first be given on a whole circuit shown in FIG. 11. There are provided sense amplifier blocks BLKn, BLKm and BLKl (19, 20 and 21) into which the integrated circuit is divided. Although an internal configuration of only the sense amplifier block BLKn (19) is shown in the figure, these blocks 19, 20 and 21 have the same configuration. In the sense amplifier blocks BLKn, BLKm and BLKl (19, 20 and 21), a word line 15 is first controlled to read data of a memory cell 7 onto bit lines 2, and a power supply Vcc (32) and a ground potential Vss are supplied to common source lines SAP (17) and SAN (16), respectively, so that P-MOS and N-MOS sense amplifiers 8 and 9 of the flip-flop type latch the data on the bit lines 2. The data thus latched is read onto first data lines DQn and XDQn (1) via N-MOS transfer transistors (i.e., decode switch) (10) controlled by a column select line Yn (6) into which a signal AYp of a column address decoder 12 is input.

To the first data lines DQn and XDQn (1) are connected a precharge circuit 71 formed of N-MOS transistors for precharging the data lines DQn and XDQn (1), and a clamp circuit 70 formed of N-MOS transistors for clamping the potential at the low level of one of the data lines DQn and XDQn (1). The data read onto the first data lines DQn and XDQn (1) is detected and amplified by a differential amplifier 4 shown in FIG. 14(a) and FIG. 14(b), and further is read onto second data lines DB and XDB (3) via a switch 11 controlled by an address decoder 13. The second data lines DB and XDB (3) are precharged by a circuit similar to the precharge circuit 71, and the data is detected and amplified by an amplifier 5 similar to the differential amplifier 4, and ultimately is read externally by an output buffer 14.

The conventional precharge power supply system of the other type will now be described below. This technique uses P-MOS transistor as well as a power supply generating potential Vcc for precharging data lines, as shown in "1992 ISSCC Technical Digest", p. 209, FIG. 1.

A second prior are which is a DRAM employing the above technique is shown in FIG. 13. For simplicity reasons, only difference with respect to the DRAM in FIG. 11 will be described below. The difference is that a precharge circuit 81 for the first data lines DQn and XDQn (1), a clamp circuit 80 for clamping the potential at the low level of one of the data lines 1, a precharge circuit 90 for the second data lines 3 and a latch circuit 91 each are formed of P-MOS transistors.

The inventors have specifically studied the operation of the first and second prior arts to find that these prior arts have the following advantages and disadvantages.

In the first prior art, since the precharge circuit 71 is formed of the N-MOS transistors, the potential precharging the first data lines 1 is equal to (Vcc−Vt) which is lower than the potential Vcc of the power supply 32 by a threshold voltage Vt of the N-MOS transistor. Meanwhile, in the second prior art, since the precharge circuit 81 is formed of the P-MOS transistors, the potential precharging the first data lines 1 is equal to the potential Vcc of the power supply 32 itself.

The amplifier shown in FIG. 14(a) and FIG. 14(b) in FIG. 14 is a generally used amplifier of the voltage detecting type. The sensitivity (sensitivity=output potential difference/input potential difference) of this amplifier is low with respect to a potential of the input data near the power supply potential Vcc of the power supply 32 as shown in FIG. 15, and generally attains a maximum value near the potential of Vcc/2. Accordingly, in the first prior art described above, the potential of the data lines 1 is precharged to the potential (Vcc−Vt) lower than the power supply voltage Vcc, so that the sensitivity can be high. However, in the second prior art described above, the low sensitivity of the amplifier cannot be avoided as long as it uses the amplifier of the voltage detecting type shown in FIG. 14(a) and FIG. 14(b).

Meanwhile, in the precharge potential generating system in the first prior art has the following disadvantage. FIGS. 12(a) and 12(b) show change of the potential of the data lines 1 which occurs due to negative bump of the power supply voltage Vcc, i.e., voltage drops thereof. If the power supply voltage Vcc does not change, transition of data on the data lines 1 can be performed in a time t1 after inverted data is transferred. However, if the power supply voltage Vcc drops after the transition, the clamp potential of the data line XDQn, which is at the low level at this point of time, lowers in accordance with lowering of the power supply voltage Vcc, but the potential of the data line DQn, 20 which is at the high level, cannot follow it and maintains the previous potential as shown in FIGS. 12(a) and 12(b), so that a large potential difference is caused in the data line pair DQn and XDQn. Consequently, when new inverted data is transferred, a long inversion time t2 is required, which may cause malfunction of an amplifier at a subsequent stage. The operation speed cannot be increased if this problem is to be overcome.

The aforementioned characteristics relating to the followability are presented by the following reasons. Both the clamp circuit 70 and decode switch 10 are formed of the N-MOS transistors. Due to this, for example, when one of the bit lines BL is kept at the power supply potential Vcc and the other bit line/BL is kept at the ground potential Vss, i.e., when the data lines DQn and XDQn are kept at the high and low levels, respectively, the N-MOS transistors forming the clamp circuit 70 and decode switch 10 present diode characteristics which cause current flow toward a low potential side, so that the data line XDQn, which is at the lower level at the time of voltage drop, is connected to the ground line via one of the N-MOS transistors of the decode switch 10 shown at a lower position in the figure and the bit line/BL as well as the N-MOS sense amplifier transistor 9, and lowers its potential in accordance with the fall of the power supply voltage Vcc. Meanwhile, in connection with the data line DQn, which is at the higher level at the time of the voltage drop of the power supply 32, a current path to the ground is disconnected by a diode formed of the N-MOS transistor of the decode switch 10 shown at the upper position in the figure, and further, it is electrically isolated from the power supply Vcc by the diode formed of the N-MOS transistor of the clamp circuit 70 shown at the upper position in the figure. For this reason, it can be considered that the potential of the data line DQn cannot follow the voltage drop. In the above description, the decode switch 10 is formed of the N-MOS transistors, so that the N-MOS transistors forming the clamp circuit 70 perform the diode function. Meanwhile, if the decode switch 10 were formed of P-MOS transistors, the P-MOS transistors forming the clamp circuit 70 would perform the diode function. Therefore, a disadvantage is caused if the transistors forming the clamp circuit 70 are of the same conductivity type as the transistors forming the decode switch 10.

The problem of the first prior art described above is not presented by the second prior art, because the power supply and the data lines in the second prior art are electrically connected together via P-MOS transistors 80, and hence the change in the power supply voltage Vcc can be followed.

Accordingly, the problem relating to operation stability of the circuit is caused if the first or second prior art is employed for data lines of recent memories having a large capacity and allowing fast operation.

SUMMARY OF THE INVENTION

An object of the invention is to provide a construction of a data line precharge power supply of an improved performance, which overcomes the disadvantages of the aforementioned prior arts while maintaining the advantages thereof, and, in other words, a semiconductor device which can ensure operation stability even with respect to negative bump of a power supply voltage without deterioration of sensitivity even if it employs an amplifier of the voltage detecting type.

In order to achieve the above object, the present invention provides a configuration, in which data lines are precharged to a predetermined potential lower than a power supply potential, so that a high sensitivity is maintained with respect to an amplifier of the voltage detecting type, and in which floating of the data line at a higher level is prevented, so that followability to negative bump of the power supply voltage is ensured.

A specific structure of a semiconductor integrated circuit according to the invention includes a plurality of sense amplifiers for latching data of memory cells using a first potential of a first power supply line having the first potential as a drive power supply potential, a decode switch formed of two transistors of a first conductivity type, a pair of data lines connected to said sense amplifiers via said decode switch for transmitting the data of said memory cells by changing their levels to high and low, respectively, an amplifier of a voltage detecting type for detecting and amplifying the data on the paired data lines, precharge means for precharging the paired data lines to a second potential of a second power supply line having the second potential lower than the first potential of the first power supply line by a predetermined potential, and anti-floating means for preventing a floating state that one of the paired data lines at the level changed into high is electrically disconnected from other lines.

Also according to the invention, the anti-floating means may be restricted to such a configuration that it is formed of a clamp circuit which is operable to clamp the potential of the data line at the level changed into low and is formed of two transistors having a second conductivity type opposite to the first conductivity type and connecting the paired data lines to the second power supply line.

Further, in the semiconductor integrated circuit according to the invention, the decode switch may be formed of an N-type transistor, and the two transistors forming the anti-floating means may be P-type transistors.

According to the semiconductor integrated circuit of the invention thus constructed, the paired data lines are precharged to the second potential lower by the predetermined potential than the first potential which is the drive power supply potential of the sense amplifier, so that an amplifier of the voltage detecting type can be used as the amplifier amplifying the signal on the data lines while maintaining good sensitivity of the amplifier of voltage detecting type.

Further, the anti-floating means prevents the data line from being electrically isolated from the other lines, so that, even when negative bump of the first potential of the first power supply line occurs, voltage drop of the data line occurs in accordance with this voltage drop follow.

Particularly, according to the invention, when one of the paired data lines, which were precharged to the second potential, is connected to the first power supply line to change its level into high and the other thereof is connected to the ground line to change its level to low, a precharge power supply of the precharge means, i.e., second power supply line is connected to the ground line via one of the transistors of the clamp circuit, the data line, the decode switch and the sense amplifier, so that the potential of the second power supply line lowers in accordance with the negative bump of the potential of the first power supply line. Further, the data line having the potential changed into the high level is connected to the second power supply line via the other transistor of the clamp circuit, and is electrically conductive with the second power supply line. Accordingly, the potential of the first data line at the high level also lowers in accordance with the negative bump of the potential of the first power supply line. As a result, when inverted data is transmitted thereafter, the inversion requires only a usual short time, so that malfunction of an amplifier in a subsequent stage does not occur.

Other objects, features, and advantages of the invention will appear more fully from the following detailed description thereof taken in connection with the accompanying drawings.

DESCRIPTION OF THE PREFERRED EMBODIMENTS

Preferred embodiments of the invention will be describe below with reference to the accompanying drawings.

(First Embodiment)

Figure 1:
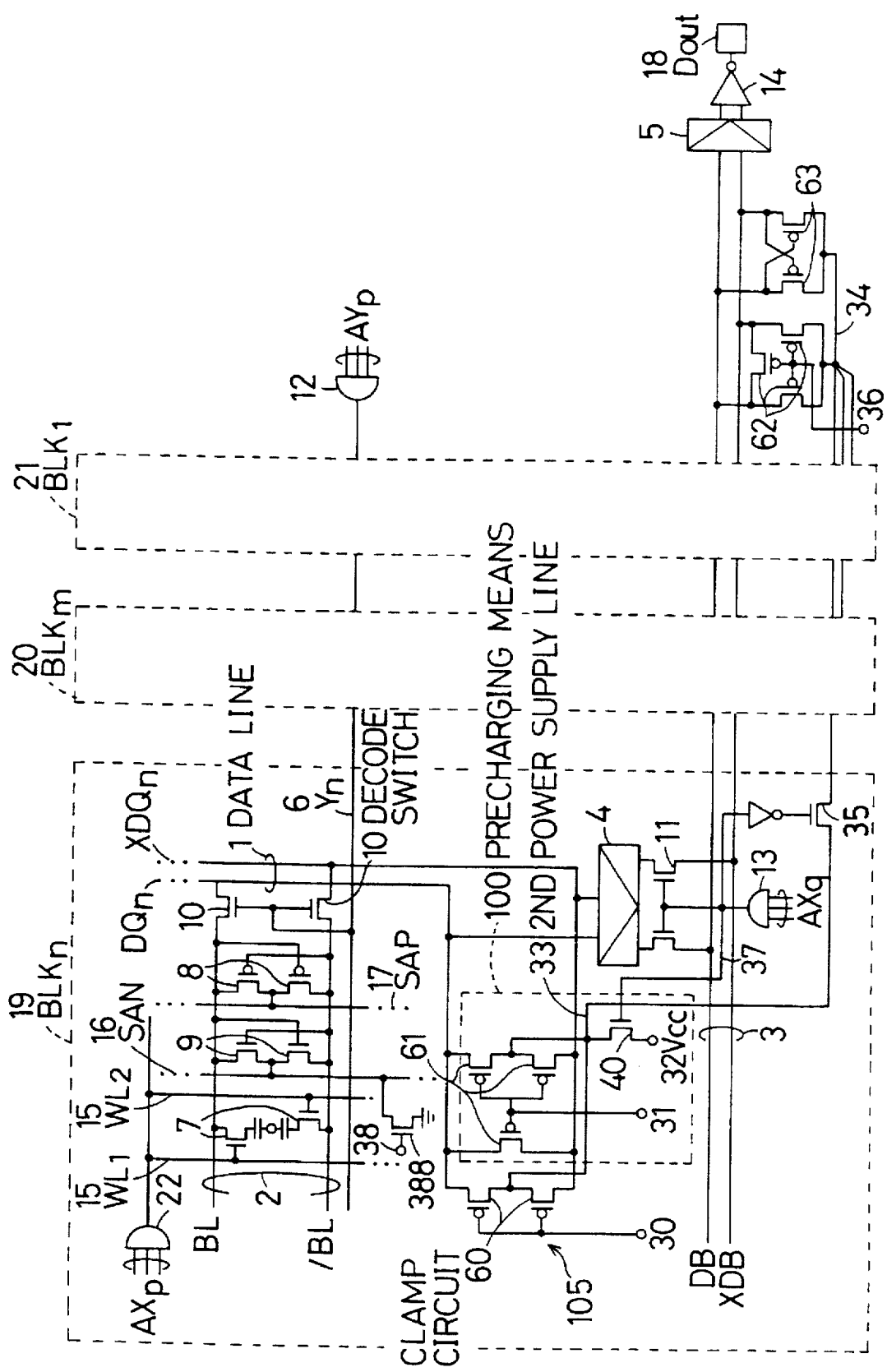
FIG. 1 shows a semiconductor integrated circuit of a first embodiment of the invention.

FIG. 1 shows a whole configuration of a semiconductor integrated circuit of the invention. In FIG. 1, 19, 20 and 21 denote a plurality of divided sense amplifier blocks BLKn, BLKm and BLKl having the same configuration, respectively. An internal configuration of only the sense amplifier block BLKn (19) will be described below.

In the sense amplifier block BLKn (19), 7 denotes a memory cell, and 15 denotes word lines WL1 and WL2, which are selected by an address decoder 22. The address decoder 22 receives a lower half AXp of a row address which is used to select a sense amplifier column and includes an upper half for selecting the sense amplifier blocks BLKn (19), ••• and the lower half AXp for selecting the sense amplifier column in the selected sense amplifier block.

2 denotes bit lines BL and /BL onto which data of the memory cell 7 is read from the word lines 15. 17 denotes a common source line SAP supplied with the power supply voltage Vcc. 16 denotes a common source line SAN supplied with the ground potential. 8 and 9 denote P-MOS and N-MOS sense amplifiers of the flip-flop type, respectively. Data read onto the bit lines BL and /BL (2) are latched by supplying the power supply voltage Vcc and the ground potential Vss to the common source lines SAP and SAN (16 and 17), respectively.

6 denotes a column select line Yn, and 12 denotes a column address decoder. The column address decoder 12 receives a lower half AYp of a column address which includes an upper half AYq for selecting the sense amplifier blocks BLKn (19), ••• and the lower half AYp for selecting the sense amplifier column in the selected sense amplifier block. The output of column address decoder 12 is sent to the column select line Yn (8), whereby N-MOS transfer transistors (decode switch) 10 connected to the column select line Yn (6) are controlled to be turned on for reading data of the memory cell 7 read onto the bit line pair BL and /BL onto the first data lines DQn and XDQn (1).

The decode switch 10, which is formed of the N-MOS transfer transistors of a first conductivity type, is controlled by the column select line Yn (6), i.e., the output of the column address decoder 12.

1 denotes the first data lines DQn and XDQn onto which the latched data on the bit lines BL and /BL (2) is read via the first decode switch 10.

Further, 100 denotes precharge means for precharging the first data lines DQn and XDQn (1) to a predetermined potential. The precharge means 100 is formed of a first power supply line 32 maintained at a first potential, which is the power supply voltage Vcc supplied to the common source line SAP, i.e., the drive power supply potential Vcc of the sense amplifiers 8 and 9, a second power supply line 33, a first N-MOS transistor 40 (i.e., a first transistor of the same conductivity type as the decode switch 10) which connects the first power supply line 32 to the second power supply line 33, and two P-MOS transistors (i.e., first transistors of a conductivity type opposite to that of the decode switch 10) 61 for connecting the second power supply line 33 to said data line pair DQn and XDQn (1).

The first N-MOS transistor 40 has a drain connected to the first power supply line 32 and a source electrode connected to the second power supply line 33. Therefore, the second power supply line 33 is supplied with the power from the first power supply line 32 via the first N-MOS transistor, and has the potential (Vcc–Vt) of which absolute value is lower than the first potential Vcc of the first power supply line 32 by the threshold voltage Vt of the first N-MOS transistor 40, so that the first P-MOS transistors 61 precharge the data lines DQn and XDQn (1) to the second potential (Vcc–Vt).

The first N-MOS transistor 40 has a gate electrode connected to a first signal line 37, i.e., the output of the address decoder 13. The address decoder 13 uses as its input the same address as the upper half (i.e., the address for selecting the sense amplifier block BLKn) AXq of the row address for selecting the sense amplifier column, and has the output power supply of the first potential Vcc.

60 denotes a clamp circuit formed of two P-MOS transistors for connecting the data line pair DQn and XDQn (1) to the second power supply line 33, and forms anti-floating means 105 for preventing floating of the data lines DQn and XDQn (1).

The transistors 61 and the clamp transistors 60 have the conductivity type of P-type (second conductivity type) which is opposite to the first conductivity type (N-type) of the first decode switch 10. According to the invention, the first conductivity type may be P-type and the second conductivity type may be N-type. However, it is assumed that the first conductivity type is N-type and second conductivity type is P-type throughout the following description.

Figure 2:
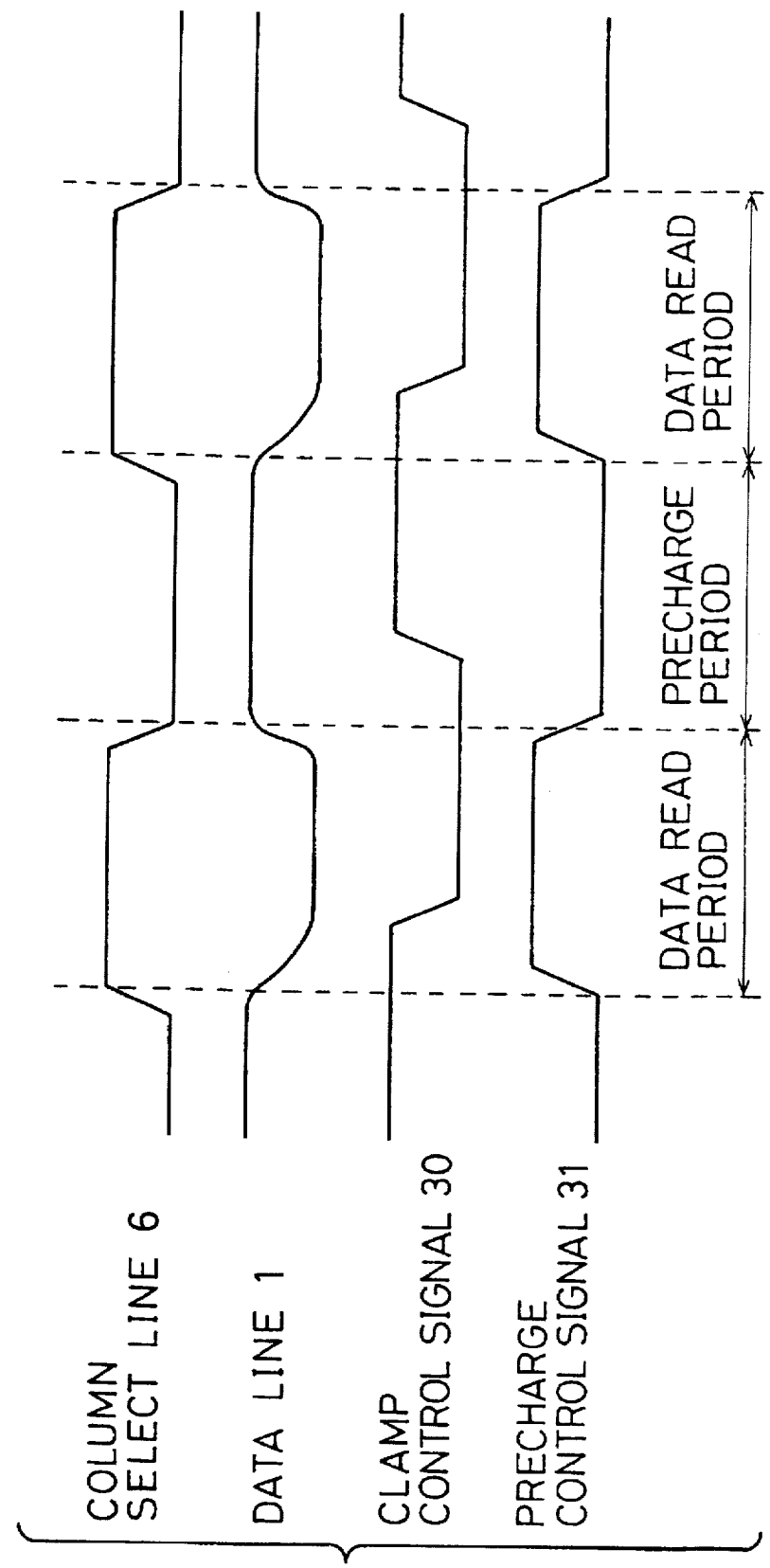
FIG. 2 shows signal waveforms at a major portion of the first embodiment of the invention.

In FIG. 1, 30 denotes a clamp control signal controlling the two P-type transistors which form the clamp circuit 80, and 31 denotes a precharge control signal controlling the three P-type transistors of the precharge means 100. These two control signals have waveforms as shown in FIG. 2. More specifically, during a data read period in which the signal of the column select line 6 is at the high level, the potential of one (e.g., DQn) of the paired data lines 1 is maintained at the high level, and the potential of the other data line 1 (e.g., XDQn) changes to the low level. The clamp control signal 30 changes to and maintains the low level during a period shifted by a predetermined time from the data read period, whereby the clamp circuit 60 is turned on, and the change of the other data line 1 to the low level is clamped at a predetermined potential. In the precharge period during which the signal of the column select line 6 is maintained at the low level, the precharge control signal 31 is set at the low level and operates the precharge means 100 to precharge the data line pair 1 to a predetermined potential.

Operation of the aforementioned embodiment will be described below.

The second power supply line 33 having the second potential (Vcc–Vt) is connected to the ground line via one of the P-MOS transistors of the clamp circuit 60, one of the N-MOS transistors of the decode switch 10, the N-MOS sense amplifier 9, the common source line SAN (16) of the sense amplifier and a transistor 388 connected to the ground line as shown in FIG. 1. Therefore, when the first predetermined potential Vcc of the first power supply line 32 negatively bumps, a ground current I44 flows through the second power supply line 33 as shown in FIG. 1, so that the potential of the second power supply line 33 can follow the negative bump. Since the clamp circuit 60 is formed of the transistors of the P-MOS type, the data lines DQn and XDQn (1) are electrically connected to the second power supply line 33 during the clamp period shown in FIG. 2, and not only the potential of the second power supply line 33 but also the potentials of the data line pair 1 follow the negative bump of the first power supply line 32 having the first potential Vcc, so that the potential difference between the paired data lines 1 is the same as that in the case where the negative bump does not occur. Accordingly, in the precharge period subsequent to the clamp period, when the second power supply line 33 of which potential follows the negative bump of the potential of the first power supply line 32 is connected to the data line pair 1 owing to the turn-on of the precharge means 100, and the data line pair 1 is precharged within the same time period as that in the case where the negative bump of the potential of the first power supply line 32 does not occur.

Referring to FIGS. 3(a) and 3(b), description will now be made on the operation in which the potentials of the data lines 1 follow the negative bump of the first power supply line 32. For the aforementioned reason, when the potential Vcc of the first power supply line 32 is stable at the time of transference of inverted data to the data lines 1, transition is naturally completed within a normal time t1. Further, when the potential Vcc of the first power supply line 32 negatively bumps, the potentials of both the data lines DQn and XDQn (1) at both the high and low levels follow the bump, so that the potential difference between them does not change. Accordingly, when the inverted data is subsequently transferred, the transition can be completed within a time t2 which is substantially equal to the data transition time t1 required when the potential Vcc of the first power supply line 32 is stable.

Figure 3:
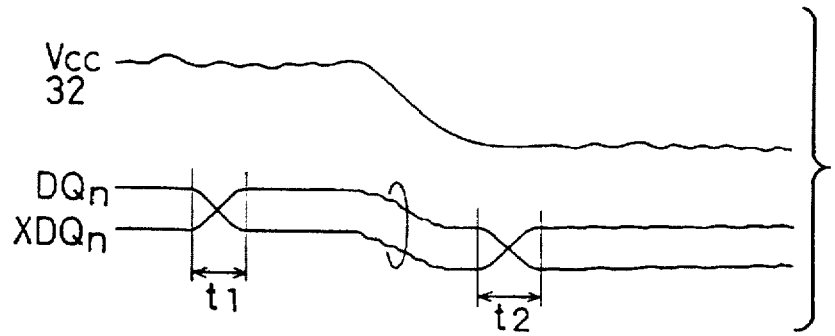
FIGS. 3(a) and 3(b) show an operation of the first embodiment of the invention, and a path of a current flowing from a second power supply line to a ground line.
Figure 3:
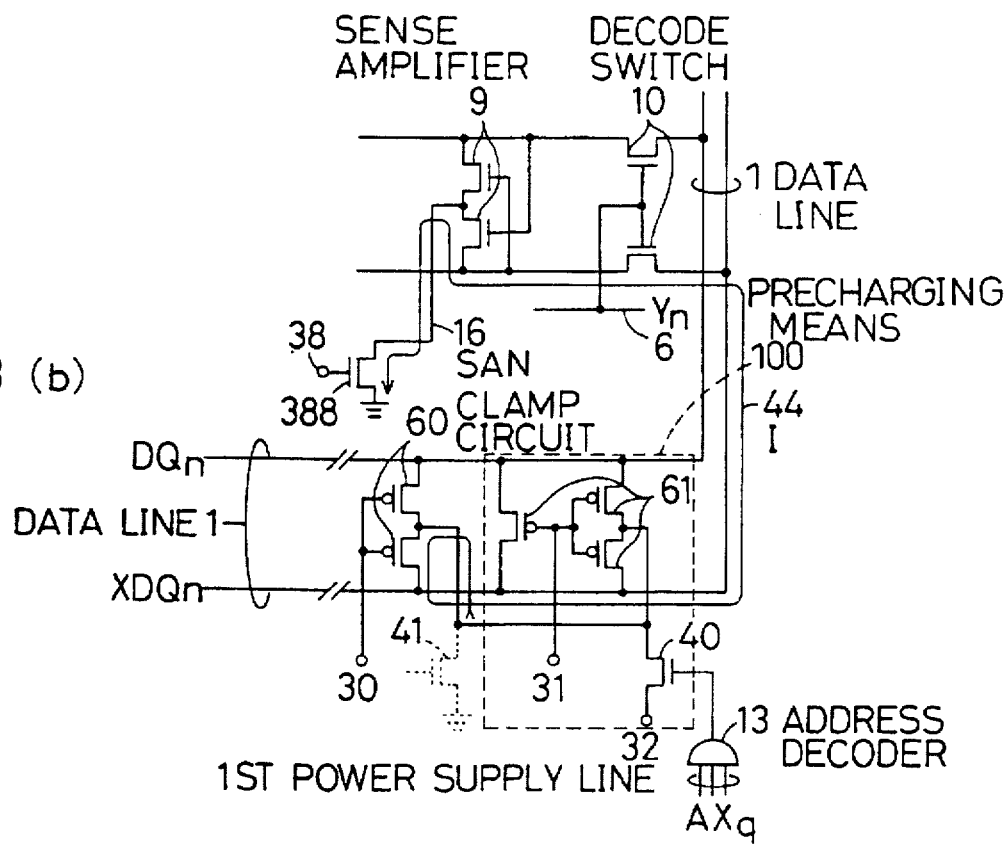

In the above embodiment, the second power supply line 33 is connected to the ground line via one of the P-MOS transistors of the clamp circuit 60, one of the N-MOS transistors of the decode switch (10), the N-MOS sense amplifier 9, the common source line SAN (16) of the sense amplifier and the transistor 388 connecting the common source line SAN (16) to the ground line. Instead of this configuration, the first power supply line 32 may be connected as shown in FIG. 3 to the ground line via the N-MOS transistor 40 and an additionally provided N-MOS transistor 41 (shown by broken line). In this configuration, the additionally provided N-MOS transistor 41 is controlled to be turned on, e.g., during the clamp period.

Specific configuration in FIG. 1 not yet described will be described below.

In the sense amplifier block BLKn (19) in FIG. 1, 4 denotes an amplifier which detects and amplifies the signal on the data lines 1, and 11 denotes a second decode switch.

3 denotes second data lines, which are commonly used by the respective sense amplifier blocks BLK1, BLKm and BLKn (19, 20 and 21), and make connection between the first and second data lines 1 and 3 via the second decode switch 11. A second differential amplifier 5 and an output buffer 14 are arranged at the second data lines 3.

Further in FIG. 1, 34 denotes a third power supply line, and 35 denotes a P-MOS transistor (third switch means) associated to the third power supply line 34. The P-MOS transistor 35 has a gate connected to the first signal line 37, i.e., the output of the address decoder 13, and is controlled to be turned on by the sense amplifier column select signal.

The third power supply line 34 is connected to a precharge circuit 62 (fifth precharge circuit) formed of three P-MOS transistors and a latch circuit 63 formed of two P-MOS transistors. The precharge circuit 62 precharges the second data lines 3 to the second potential (Vcc–Vt) of the second power supply line 33, and the latch circuit 63 latches the second data lines 3 at the second potential (Vcc–Vt) of the second power supply line 33.

The above configuration provides the following advantage in such a case that the second data lines 3 are commonly used by the data lines 1 selected by the address and other data lines of a plurality of sense amplifier columns selected by different addresses. Thus, even if there is not provided a precharge power supply circuit dedicated to the second data lines 3, it possible, similarly to the data lines 1, to obtain an input potential of the second data lines 3 allowing high sensitivity of the amplifier 5 at the next stage and to follow the negative bump of the first power supply line 32, owing to provision of the one P-MOS transistor 35.

Figure 4:
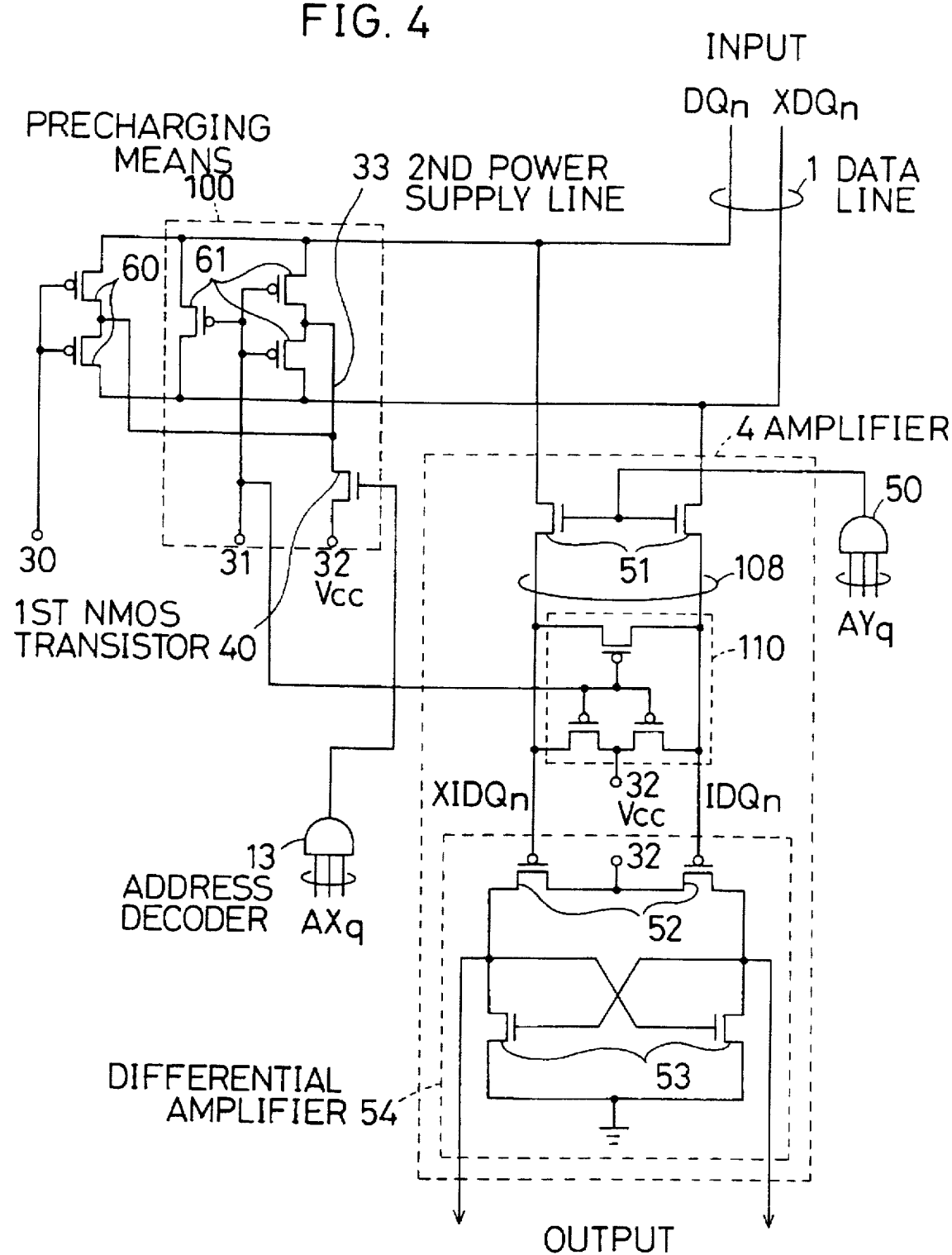
FIG. 4 specifically shows a configuration near a differential amplifier of the first embodiment of the invention.

FIG. 4 specifically shows an internal configuration of the differential amplifier 4 which detects and amplifies the data of the data lines 1 in FIG. 1.

Figure 5:
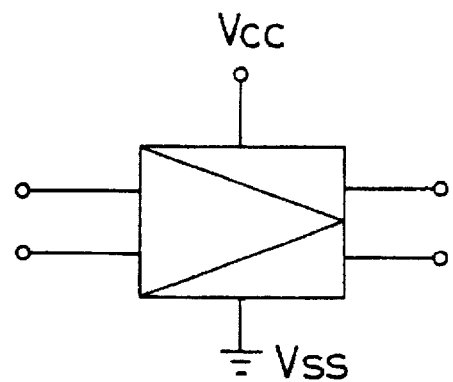
FIG. 5 shows a function of a differential amplifier of the first embodiment of the invention.

The differential amplifier 4 includes a differential amplifier portion 54 formed of complementary input gate transistors 52 of the P-MOS type and two N-MOS transistors 53. The differential amplifier portion 54 is connected to the first power supply line 32 and the ground line as shown also in FIG. 5, and interrupts the application of the potential Vcc of the first power supply line 32 when the two P-MOS transistors 52 are turned off in response to the input signal supplied to their gates.

The differential amplifier 4 is further provided with two N-MOS transistors 51 (first switch means). The N-MOS transistors 51 are controlled by the output signal of the column address decoder 50. The column address decoder 50 is supplied with the upper half AYq of the column address and provides an output potential equal to the first potential Vcc of the first power supply line 32.

Further, input data lines IDQn and XIDQn (108) of the differential amplifier 4 connected to the respective gates of the two N-MOS transistors 53 of the differential amplifier 54 are provided with a precharge circuit (second precharge means) 110 formed of three P-MOS transistors which precharge the potential of the data lines 108 to the first potential Vcc of the first power supply line 32.

Figure 10:
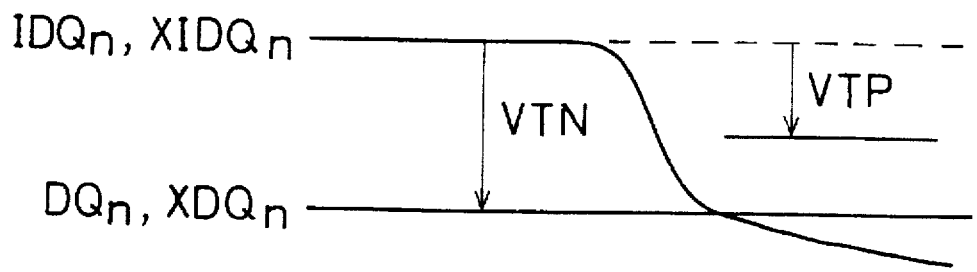
FIG. 10(a) shows a relationship between threshold voltages of N-MOS and P-MOS transistors forming a differential amplifier.
FIG. 10(b) shows change characteristics of threshold voltages of N-MOS and P-MOS transistors forming a differential amplifier with respect to a power supply voltage.
FIG. 10(c) is a graph showing variation of threshold voltages of N-MOS transistor and P-MOS transistor with respect to a power supply voltage.
Figure 10:
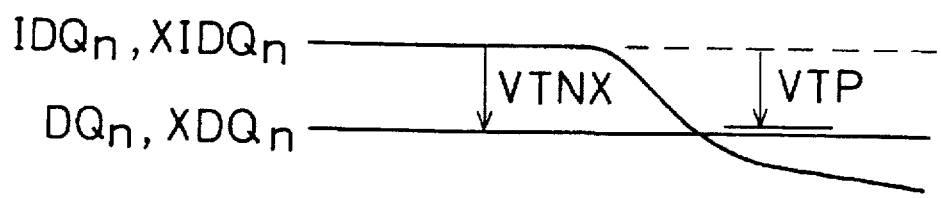
Figure 10:
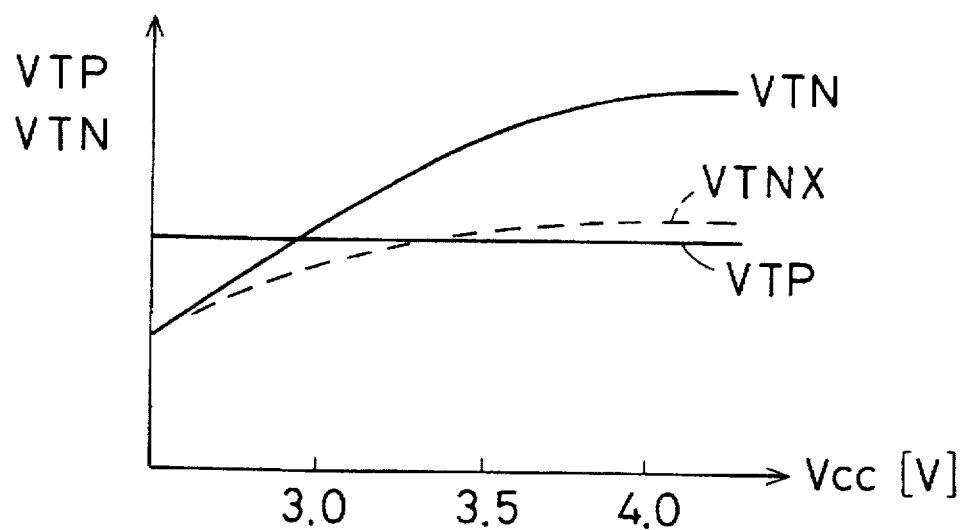
Figure 11:
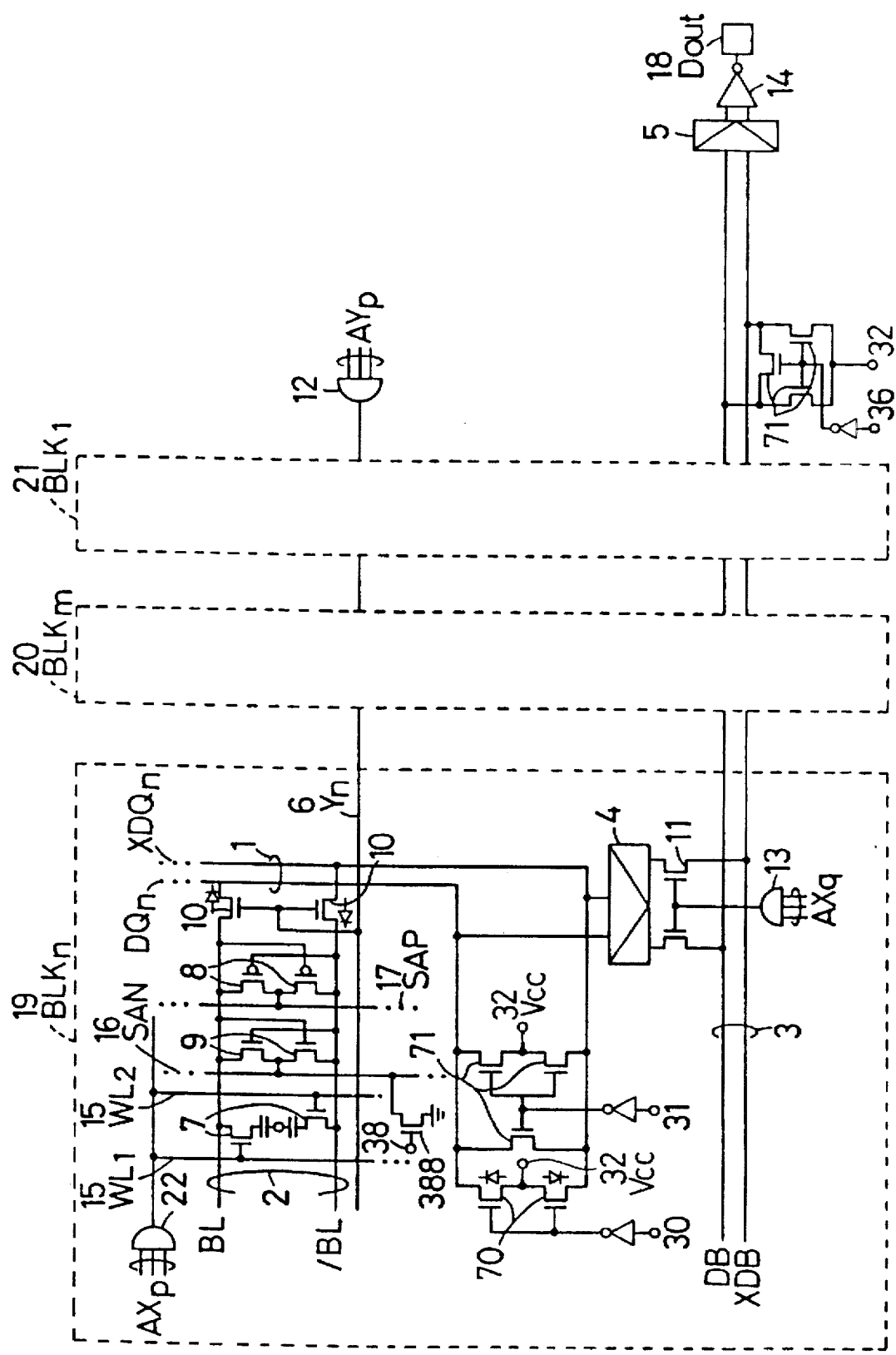
FIG. 11 shows a semiconductor integrated circuit in a first prior art.

Referring to FIGS. 10(a), (b) and (c), a relationship between the threshold voltage VTN of the two N-MOS transistors 51 and the threshold voltage VTP of the two input gate transistors 52 of the P-MOS type of the differential amplifier portion 54 is set to satisfy the following conditions. As shown in FIGS. 10(a) and 10(b), when the threshold voltage VTN is higher than the threshold voltage VTP, both the complementary input gate transistors 52 of the P-MOS type are turned on, resulting in slight but inevitable increase of the current consumption of the differential amplifier 4. Therefore, a smaller difference between their threshold voltages is preferable. The value of the threshold voltage VTN is increased, as shown in FIG. 10(c), by a substrate bias effect determined by the potential difference between the substrate electrode and the source electrode of the N-MOS transistor 51, and the substrate bias effect increases in proportion to the power supply voltage Vcc. Consequently, the threshold voltage VTN increases In proportion to the power supply voltage Vcc. Accordingly, by setting a formation substrate concentration of the N-MOS transistor 51 to a low value, the substrate bias effect can be suppressed, and increase of the threshold voltage VTN can be suppressed even if the power supply voltage Vcc increases.

Figure 6:
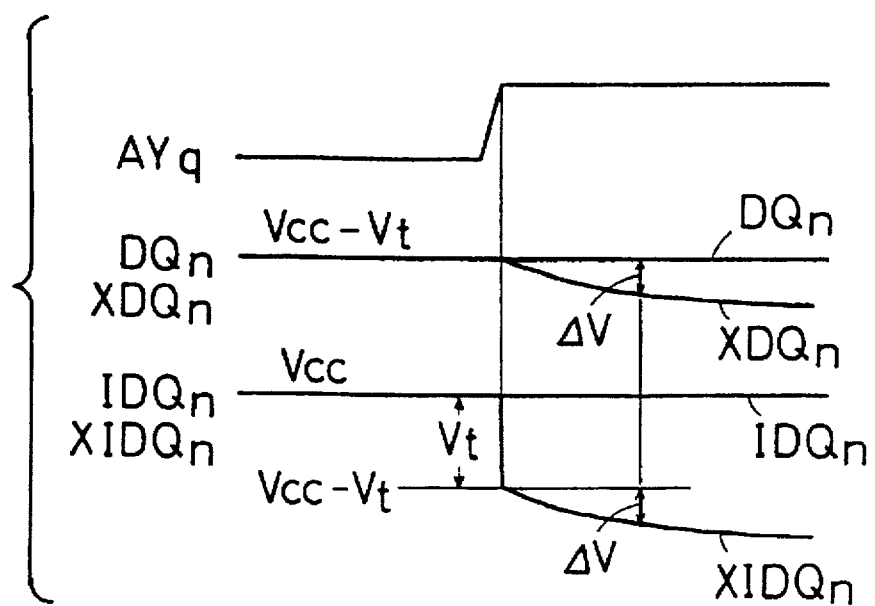
FIG. 6 shows potential change at data lines and input data lines of a differential amplifier of the first embodiment of the invention.

The differential amplifier 4 shown in FIG. 4 operates as follows. The data lines 1 having a long wiring length and hence a large floating capacitance is capacitively isolated from the input data lines (108) of the differential amplifier 4 by the two N-MOS transistors 51. Further, the data lines 1 are precharged to the potential (Vcc−Vt) which is lower by the threshold voltage Vt than the potential Vcc of the first power supply line 32, and the input data lines 108 of the differential amplifier 4 are precharged to the potential Vcc of the first power supply line 32. Therefore, when even slight transition of one of the paired data lines 1 toward the lower level side occurs as shown in FIG. 6, one of the paired input data lines 108 of the differential amplifier 4 significantly lowers its level by an amount corresponding to the threshold voltage Vt from the potential Vcc level at the same time, and thereafter one of the paired data lines 1 lowers in accordance with the potential change. Therefore, the differential amplifier 4 operates with good sensitivity near the potential (Vcc−Vt) which is lower by the threshold voltage Vt than the potential Vcc of the first power supply line 32. Further, assuming that the potential of one of the data lines 108 of the differential amplifier 4 which rapidly lowered by the amount corresponding to the threshold voltage Vt further lowers for ΔV, the potential difference between the paired input data lines 108 goes to a value of (Vt+ΔV) which is larger than that in the case where the input data line pair 108 is precharged to the potential (Vcc−Vt). Therefore, the differential amplifier 4 can operate stably at a high speed.

Although FIG. 4 shows the internal configuration of the differential amplifier 4 detecting and amplifying the data of the data lines 1, the second differential amplifier 5 detecting and amplifying the data of the second data lines 3 has the similar configuration.

(Second Embodiment)

The second embodiment of the invention will be described below with reference to FIG. 7. The same portions as those in FIG. 1 bear the same reference numbers or characters and will not be described below. Only the difference will be described below.

Figure 7:
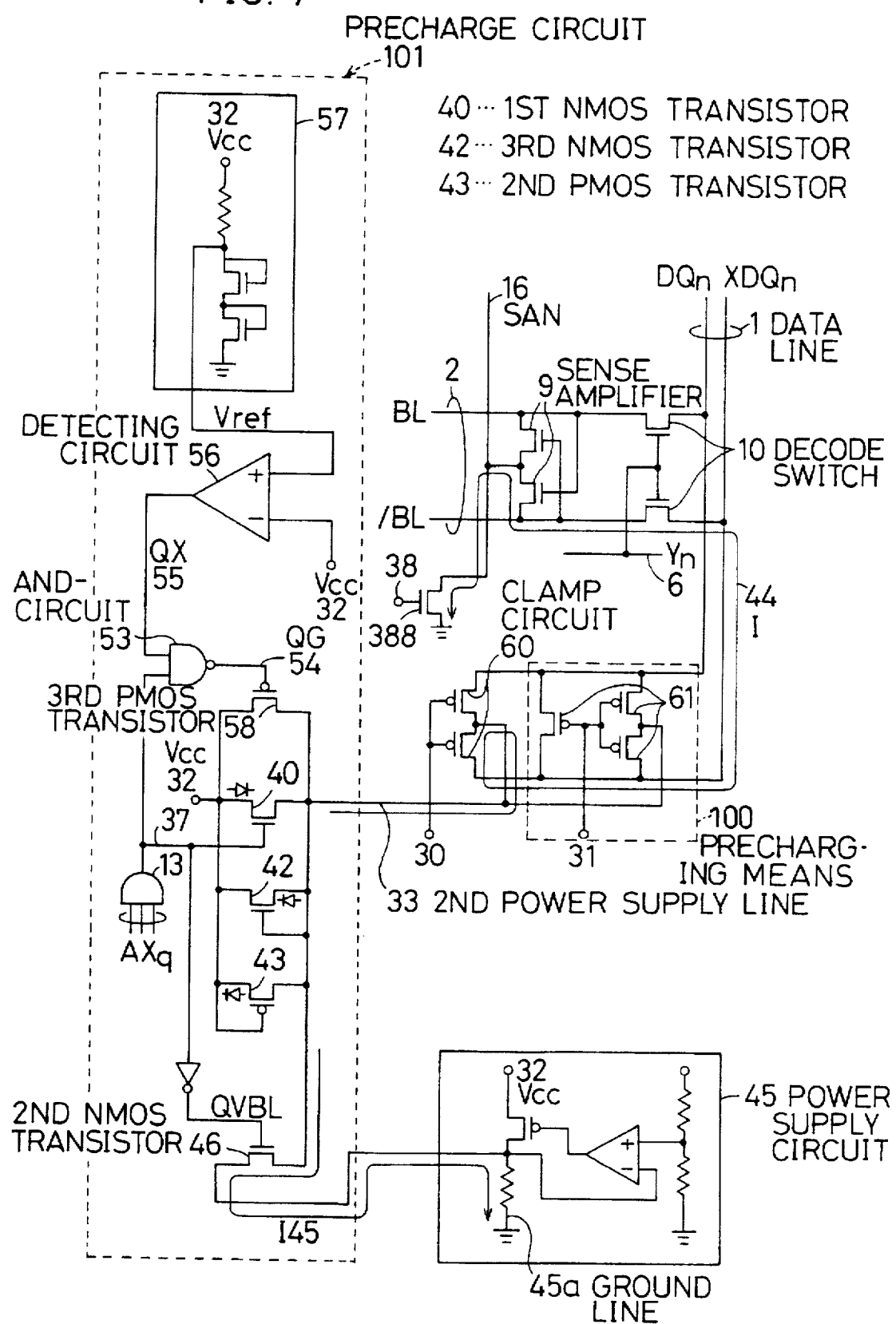
FIG. 7 shows a semiconductor integrated circuit of a second embodiment of the invention.

FIG. 7 shows an embodiment relating to an improvement of the precharge means 100. In FIG. 7, a precharge circuit 101 is provided, in addition to the first N-MOS transistor 40, with a second N-MOS transistor (second transistor of the same conductivity type as the decode switch 10) 46 connecting the second power supply line 33 to the ground line 45a.

The second N-MOS transistor 46 has a drain electrode connected to the second power supply line 33 having the second potential (Vcc−Vt) as well as a source electrode connected to the output of the power supply circuit which produces a potential (Vcc/2) equal to half the first potential Vcc, i.e., precharge potential of the bit line 2. A gate electrode of the transistor 46 is connected to a signal QVBL formed by inverting the nonselect signal 37 of the address decoder 13. The second N-MOS transistor 46 is controlled to be turned on when the sense amplifier column is nonselected.

The output of the power supply circuit 45 is configured to prevent a high impedance state, and for this purpose, is grounded via a semiconductor device serving as a resistor and the ground line 45a.

Advantages of the above configuration will be described below. The second power supply line 33 attains the high impedance when the output of the address decoder 13 for selecting the sense amplifier is the nonselect output, i.e., the output at the low level, and may presents a problem that the negative bump of the potential of the first power supply line 32 cannot be followed if it occurs during the nonselect period of the sense amplifier. Therefore, when the sense amplifier is selected at the next cycle while the negatively bumped state of the potential of the first power supply line 32 is maintained, the second power supply line 33 has not yet followed the change of the power supply potential, so that the operation voltages of the precharge means 100 and the clamp circuit 6 change, which may cause a problem in the operation stability. However, owing to the aforementioned configuration, when the sense amplifier is not selected, the second power supply line 33 is connected to the ground line 45a of the power supply circuit 45, i.e., is grounded via the turned-on second N-MOS transistor 46, so that the power supply potential change can be followed, and hence the precharge means 100 and the clamp circuit 60 can operate stably.

Specific configurations in FIG. 7 not yet described will be described below.

The precharge circuit 101 in FIG. 7 is provided at the vicinity of the first N-MOS transistor 40 with a third N-MOS transistor (third transistor of the same conductivity type as the decode switch 10) 42 connecting the first power supply line 32 having the first potential Vcc to the second power supply line 33.

Thus, the third N-MOS transistor 42 has a large transistor size, and have a gate electrode and a source electrode which are commonly connected to the second power supply line 33 as well as a drain electrode connected to the first power supply line 32 having the first potential Vcc.

Figure 8:
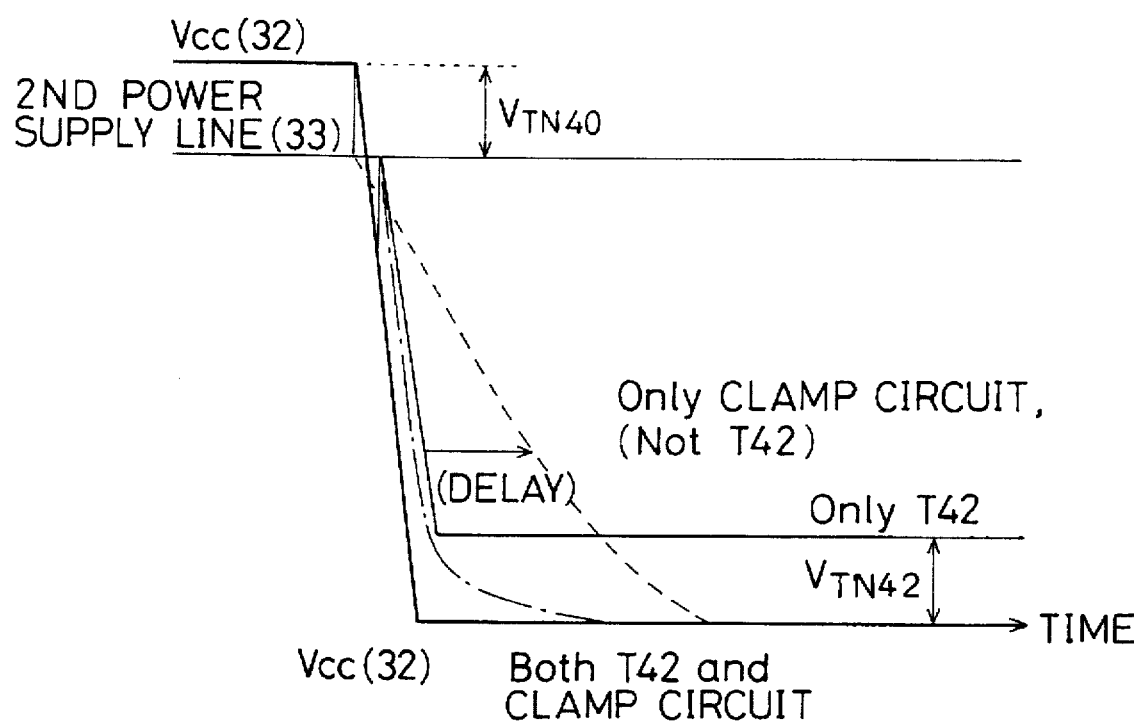
FIG. 8 shows an effect achieved by provision of a third transistor of the same conductivity type as that of a decode switch.
Figure 9:
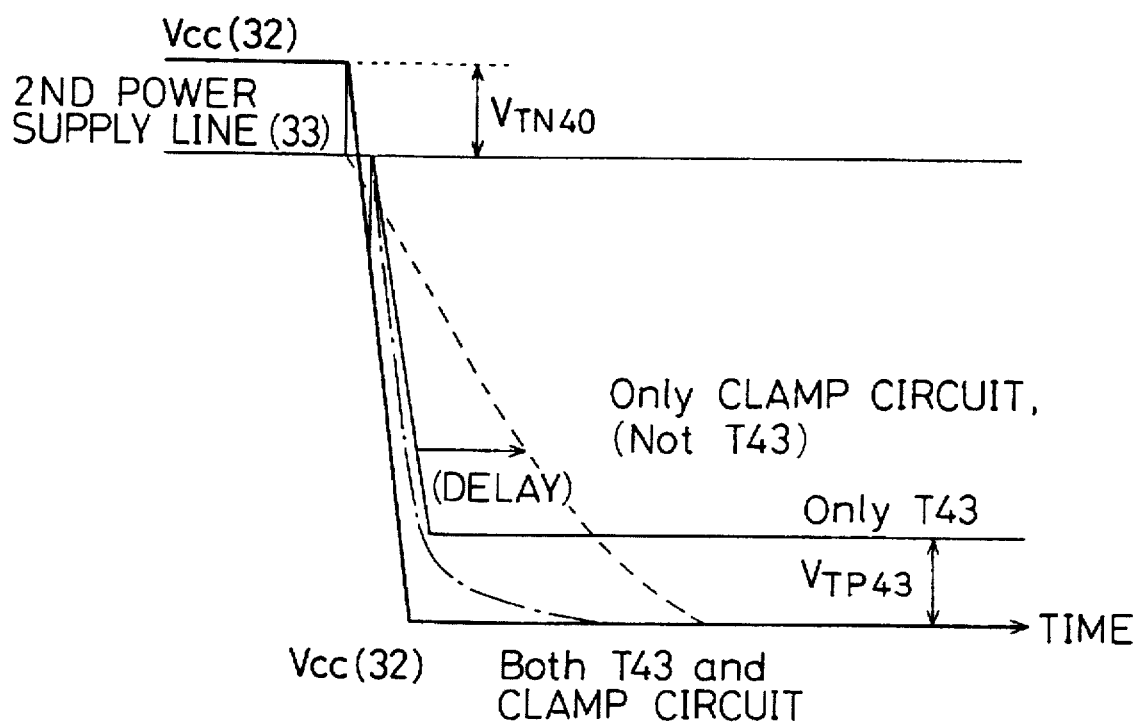
FIG. 9 shows an effect achieved by provision of a second transistor of a conductivity type opposite to that of a decode switch.

An effect of the third N-MOS transistor 42 will be described below. In order to improve time followability of the potential (Vcc−Vt) of the second power supply line 33 at the time of negative bump of the potential Vcc of the first power supply line 32, it is desirable to increase the size of the two P-MOS transistors forming the clamp circuit 60 for increasing a value of the through current flowing through the clamp circuit 60. However, increase of the through current value increases the current consumption. In practice, therefore, the size of the two P-MOS transistors of the clamp circuit 60 is determined such that the negative bump of the potential Vcc of the first power supply line 32 may be followed with a delay time τ as indicated by broken line in FIG. 8 for preventing significant increase of the through current. The third N-MOS transistor 42 serves as a diode directed from the second power supply line 33 toward the first power supply line 32 as shown in FIG. 7. Therefore, when the potential Vcc of the first power supply line 32 negatively bumps to a value lower than the potential of the second power supply line 33, the electric charges existing in the second power supply line 33 at this point of time move to the first power supply line 32 through the third N-MOS transistor 42 to cause rapid drop of the potential of the second power supply line 33. Since this movement of charges does not increase the current consumption, preferable time followability can be obtained, and specifically the potential of the second power supply line 33 can rapidly follow the negative bump of the potential Vcc of the first power supply line 32 without causing significant increase of the current consumption as shown by alternate long and short dash line in the figure.

Specific configuration in FIG. 7 not yet described will further be described below.

In FIG. 7, the precharge circuit 101 is further provided with a second P-MOS transistor (second transistor of a conductivity type opposite to that of the decode switch 10) 43 connecting the power supply line 32 having the first potential Vcc to the second power supply line 33.

The second P-MOS transistor 43 has a large transistor size, and has a gate electrode and a source electrode which are commonly connected to the power supply line 32 having the first potential Vcc as well as a drain electrode connected to the second power supply line 33.

Effects by the second P-MOS transistor 43 will be described below. This configuration naturally provides the same effect as the configuration including the third N-MOS transistor 42 described before, and can further provide the following effect. According to this configuration, the second P-MOS transistor 43 for following the negative bump characteristics of the potential of the first power supply line 32 having the first potential Vcc has the conductivity type of not N-type but P-type. Therefore, in contrast to the N-type, the source follower operation at the vicinity of the potential Vcc of the first power supply line 32 can be avoided. Thus, the potentials of both the substrate electrode and the source electrode of the second P-MOS transistor 43 are equal to the power supply potential Vcc and no potential difference occurs between them, so that it is possible to suppress rise of the threshold voltage which may be caused by the substrate bias effect.

Although this embodiment is provided with the third N-MOS transistor 42 and the second P-MOS transistor 43, one of them may be naturally eliminated.

Specific configurations in FIG. 7 not yet described will be described below.

In FIG. 7, the precharge circuit 101 includes a detecting circuit 56 detecting whether or not the potential of the first voltage Vcc of the first power supply line 32 is higher than a first determination level (reference potential Vref), an AND circuit 53 supplied with an output QX (55) of the circuit 56 and the output signal of the address decoder 13, and a third P-MOS transistor (third transistor of a conductivity type opposite to that of the decode switch 10) 58.

The third P-MOS transistor 58 has a source electrode connected to the first power supply line 32, a drain electrode connected to the second power supply line 33 and a gate electrode controlled by an output signal QG (54) of the AND circuit 53.

A generating circuit 57 generating the reference voltage Vref for the detecting circuit 56 is provided for the determination level, for example, in the case where the first potential Vcc of the power supply line 32 is the potential of 2.0 V, and the configuration of the generating circuit 57 is particularly restricted.

The effect by the above configuration is as follows.

As the voltage Vcc of the first power supply line 32 decreases, the precharge potential (Vcc−Vt) of the second power supply line 33 goes to 1.0 V (i.e., Vcc−Vt=2.0 V−1.0 V) and hence a gate/source potential of the first P-MOS transistor 61 decreases, so that the precharge may not be sufficiently performed within a restricted time. However, when the potential Vcc of the first power supply line 32 decreases below 2.0 V, the third P-MOS transistor 58 operates to support or assist the first N-MOS transistor 40, so that the precharge potential of the second power supply line 33 can be set to a value intermediate the potential (Vcc−Vt) and the potential Vcc of the first power supply line 32 or a value near the potential Vcc of the first power supply line 32, which overcomes the problem relating to the low voltage.

What is claimed is:

1. A semiconductor integrated circuit comprising: a plurality of sense amplifiers for latching data of memory cells using a first potential of a first power supply line having said first potential as a drive power supply potential;

a decode switch formed of two transistors of a first conductivity type;

a pair of data lines having different levels connected to said sense amplifiers via said decode switch for transmitting the data of said memory cells by changing the levels of said pair of data lines to high and low, respectively;

an amplifier of a voltage detecting type for detecting and amplifying the data on said paired data lines;

precharge means for precharging said paired data lines to a second potential of a second power supply line having said second potential lower than said first potential of said first power supply line by a predetermined potential; and anti-floating means for preventing a floating state that one of said paired data lines at the level changed into high is electrically disconnected from other lines, wherein said anti-floating means includes two transistors having a second conductivity type opposite to the first conductivity type and connecting said paired data lines to said second power line.

2. The semiconductor integrated circuit of claim 1, wherein said decode switch is formed of an N-type transistor, and said two transistors forming said anti-floating means are P-type transistors.

3. The semiconductor integrated circuit of claim 1, further comprising:

an amplifier amplifying the signal on said data lines; a said amplifier including, different precharge means for precharging a potential of input data lines of said amplifier to the first potential equal to the drive power supply potential of said sense amplifier, switch means arranged between said data lines and said input data lines of said amplifier, and said switch means being controlled by an output signal of an address decoder.

4. The semiconductor integrated circuit of claim 1, further comprising different data lines receiving the signal on said data lines after being amplified, and an amplifier amplifying the signal on said different data lines; and said amplifier including, still different precharge means for precharging said different data lines to a second potential which is lower by a predetermined potential than the first potential equal to the drive power supply potential of the sense amplifier, another precharge means for precharging input data lines of said amplifier to the first potential, switch means arranged between said different data lines and said input data lines of said amplifier, and said switch means being controlled by an output signal of an address decoder.

5. The semiconductor integrated circuit according to claim 1, further comprising:

a clamp circuit which is operable to clamp the potential of the data line at the level changed into low, and includes said two transistors having a second conductivity type opposite to the first conductivity type and connecting said paired data lines to said second power line, wherein said anti-floating means includes the two transistors of said clamp circuit.

6. The semiconductor integrated circuit of claim 1, further comprising:

different data lines receiving a signal from said data lines;

a third power supply line connected to said second power supply line and provided as a power supply for precharging said different data lines, switch means provided at said third power supply line, and said switch means being controlled to be turned on a sense amplifier column select signal of an address decoder inputting the same address as an address for selecting a sense amplifier column.

7. The semiconductor integrated circuit of claim 6, wherein an amplifier for amplifying the signal on said data lines and a different decode switch being controlled to be turned on by the sense amplifier column select signal of said address decoder are arranged between said data lines and said different data lines, and said third power supply line is connected to a fifth precharge circuit precharging said different data lines to the second potential and a latch circuit for latching said different data lines at the second potential.

8. The semiconductor integrated circuit of claim 1, wherein said precharge means includes:

a second power supply line;

a first transistor provided for connecting said first power supply line to said second power supply line and having the same conductivity type as said decode switch; and two second transistors provided for connecting said second power supply line to said pair of data lines and having a conductivity type opposite to that of said decode switch.

9. The semiconductor integrated circuit of claim 8, wherein said precharge means further includes:

a detecting circuit for detecting whether the first potential which is the drive power supply potential of said sense amplifier is higher than a determination level or not, an AND circuit for carrying out logical AND between the output of, said detecting circuit and a sense amplifier column select signal of an address decoder inputting the same address as an address for selecting a sense amplifier column, a third transistor provided independently from said first transistor of the same conductivity type as the decode switch for connecting said first power supply line to said second power supply line, and having a conductivity type opposite to that of said decode switch, and said third transistor being controlled by the output of said AND circuit.

10. The semiconductor integrated circuit of claim 8, wherein said second potential of said data lines precharged by said precharge means is lower by a magnitude corresponding to the threshold voltage of the first transistor than said first potential which is a drive power supply potential of the sense amplifier.

11. The semiconductor integrated circuit of claim 8, wherein said first transistor of said precharge means is controlled to be turned on by a sense amplifier column select signal of an address decoder using as its address the same address as the address for selecting the sense amplifier column.

12. The semiconductor integrated circuit of claim 11, where said precharge means further includes:

a third transistor connecting said second power supply line to a ground line and having the same conductivity type as said decode switch, and said third transistor is controlled to be turned on by a signal of said address decoder other than said sense amplifier column select signal.

13. The semiconductor integrated circuit of claim 12, wherein said ground line is a ground line of a power supply circuit producing a precharge potential of a bit line approximately equal to half the first potential which is the drive power supply potential of said sense amplifier.

14. The semiconductor integrated circuit of any one of claims 8, 10, 11, 12 or 13, wherein said precharge means further includes:

a different transistor connecting said first power supply line to said second power supply line and having the same conductivity type as said decode switch, and said different transistor being controlled by the potential said second power supply line.

15. The semiconductor integrated circuit of any one claims 8, 10, 11, 12 or 13, wherein said precharge means further includes:

a still different transistor connecting said first power supply line to said second power supply line and having a conductivity type opposite to that of said decode switch, and said still different transistor being controlled by the potential said first power supply line.

* * * * *

UNITED STATES PATENT AND TRADEMARK OFFICE
CERTIFICATE OF CORRECTION

PATENT NO. : 5,642,314

DATED : June 24, 1997

INVENTOR(S) : Hiroyuki Yamauchi

It is certified that error appears in the above-identified patent and that said Letters Patent is hereby corrected as shown below:

The title page, showing the illustrative figure, shown should be deleted to appear as per the attached title page.

The drawing sheet, consisting of Figs. 1, 11, 12, and 13, should be deleted to be replaced with the drawing sheets, consisting of Figs. 1,11,12, and 13, as shown on the attached page.

Signed and Sealed this

Seventh Day of October, 1997

*Attest:*

BRUCE LEHMAN

*Attesting Officer*  Commissioner of Patents and Trademarks

United States Patent [19]

Yamauchi

[11] Patent Number: 5,642,314
[45] Date of Patent: Jun. 24, 1997

[54] SEMICONDUCTOR INTEGRATED CIRCUIT

[75] Inventor: Hiroyuki Yamauchi, Osaka, Japan

[73] Assignee: Matsushita Electric Industrial Co., Ltd., Osaka, Japan

[21] Appl. No.: 706,196

[22] Filed: Aug. 30, 1996

Related U.S. Application Data

[63] Continuation of Ser. No. 366,113, Dec. 29, 1994, abandoned.

[30] Foreign Application Priority Data

Dec. 29, 1993 [JP] Japan ..................... 5-351187

[51] Int. Cl.$^6$ ............................................. G11C 7/00
[52] U.S. Cl. ................ 365/189.06; 365/203; 365/205; 365/207
[58] Field of Search ................. 365/189.06, 203, 365/207, 226, 149, 205

[56] References Cited

U.S. PATENT DOCUMENTS 5,091,886  2/1992  Miyawaki et al. ............ 365/189.06
5,369,613  11/1994 Matsui ......................... 365/189.06

Primary Examiner—David C. Nelms
Assistant Examiner—Huan Hoang
Attorney, Agent, or Firm—McDermott, Will & Emery

[57] ABSTRACT

A second power supply line is connected to a first power supply line via an N-MOS transistor and has a second potential (Vcc–Vt). The second power supply line is grounded to a ground line via one of P-MOS transistors of a clamp circuit, one of N-MOS transistors of a decode switch, an N-MOS sense amplifier, and a common source line of sense amplifiers. Accordingly, even when a power supply potential negatively bumps, a ground potential flows from the second power supply line through a current path thus formed, and the potential of the second power supply line can follow the negative bump. Since the transistors forming the clamp circuit are of the P-MOS type, the data lines are electrically connected to the second power supply line, so that the data lines can follow the negative bump of the first power supply line. Accordingly, it is possible to provide a data line precharging system which can follow the negative bump of the power supply without deteriorating the sensitivity of the amplifier of the voltage detecting type.

15 Claims, 14 Drawing Sheets

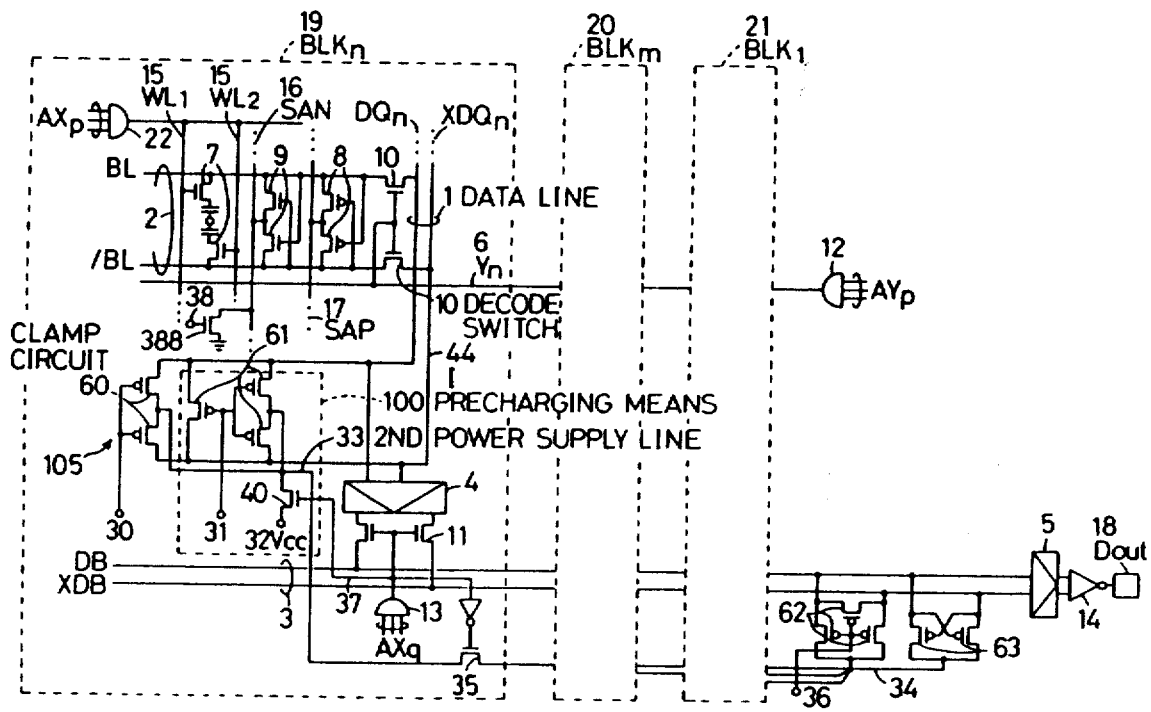

Figure 12:
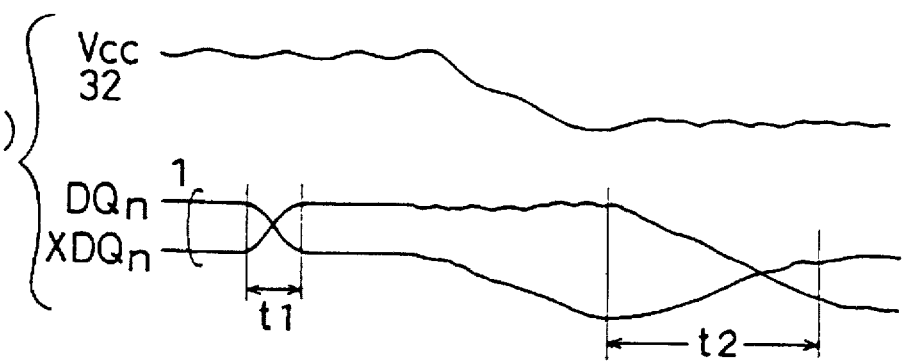
FIG. 12(a) shows a problem of the first prior art and FIG. 12(b) shows a path of a current flowing to a ground line from a data line at a level changed to low in the first prior art.
Figure 12:
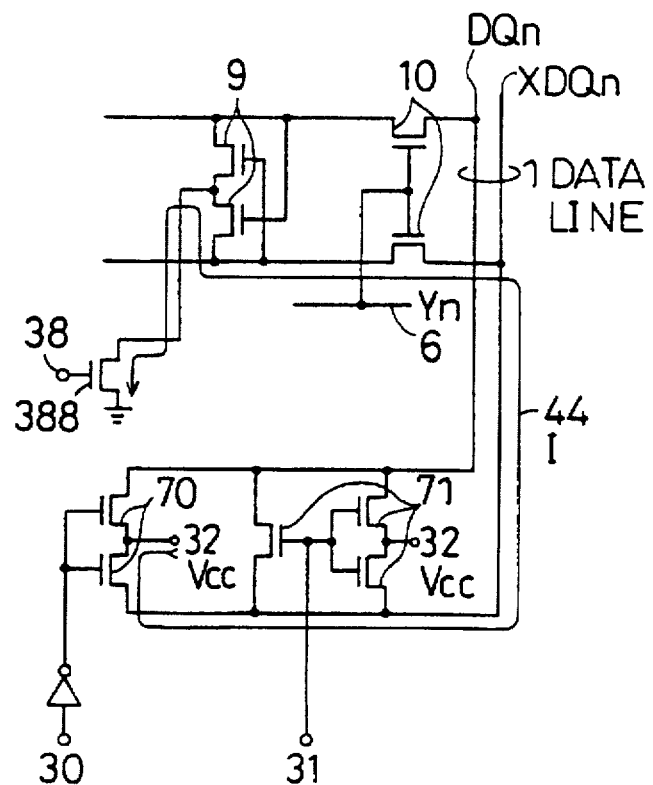
Figure 13:
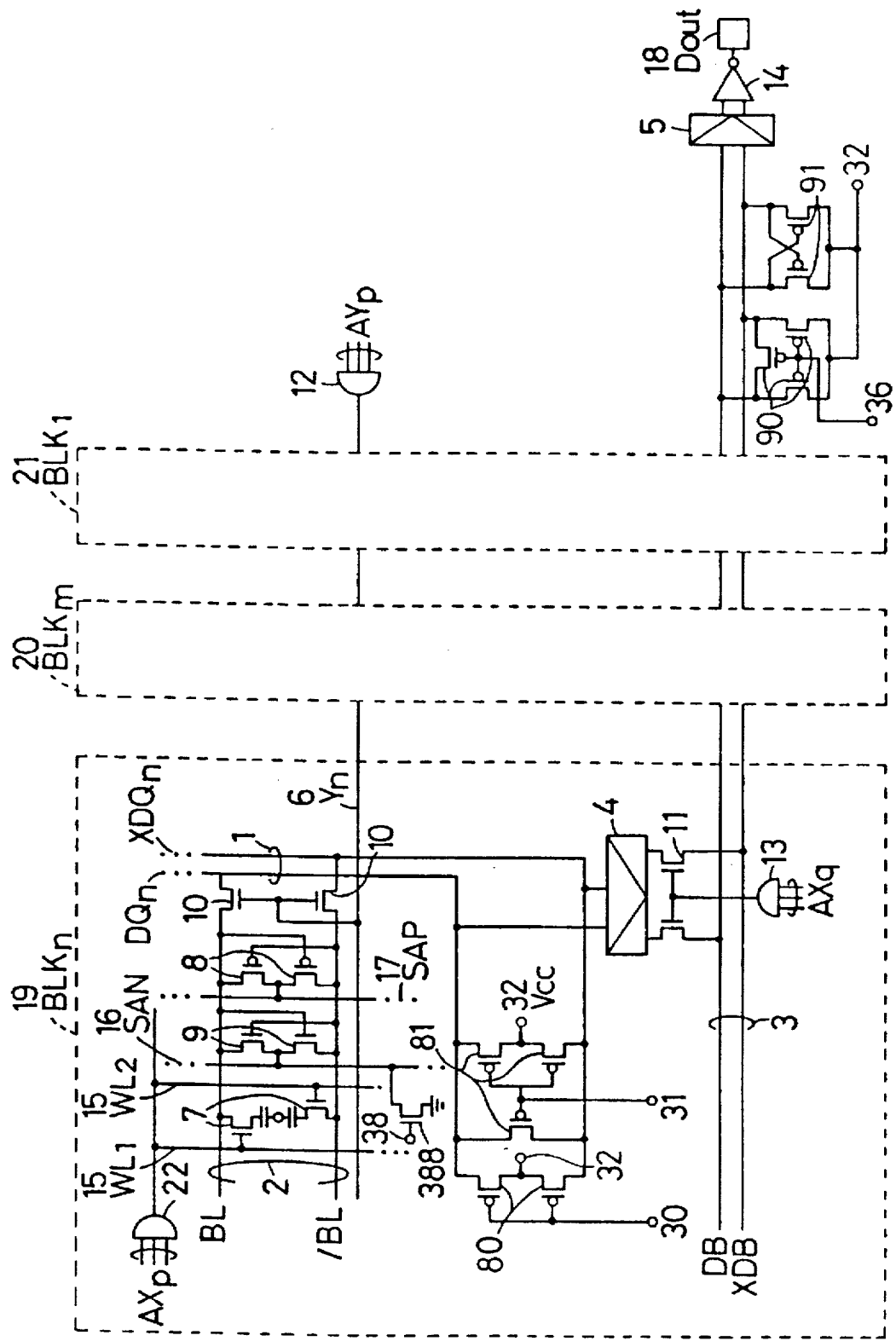
FIG. 13 shows a semiconductor integrated circuit in a second prior art.
Figure 14:
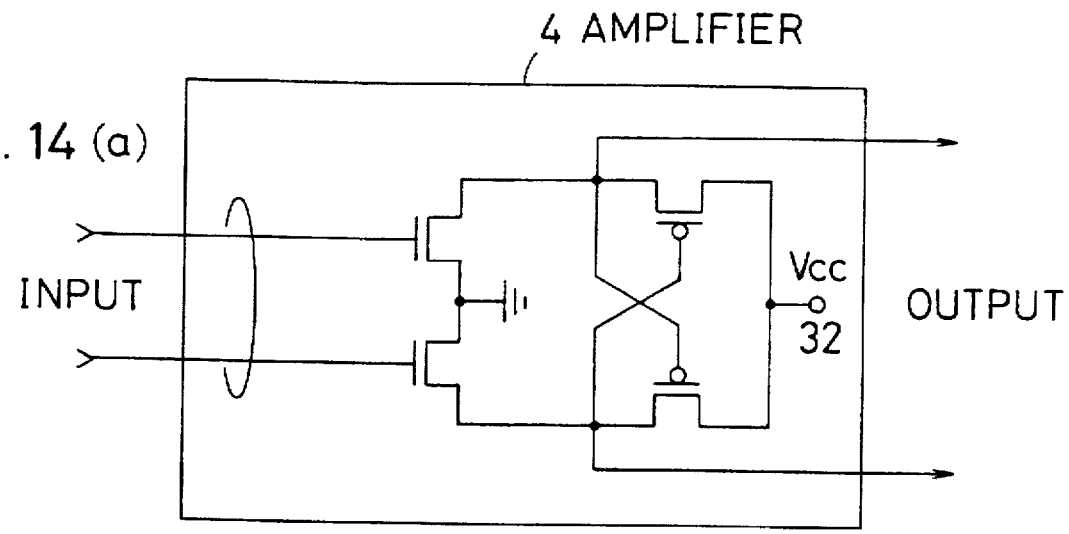
FIG. 14(a) shows a specific configuration of a voltage detecting type amplifier, and FIG. 14(b) another example of specific configuration of the voltage detecting type amplifier.
Figure 14:
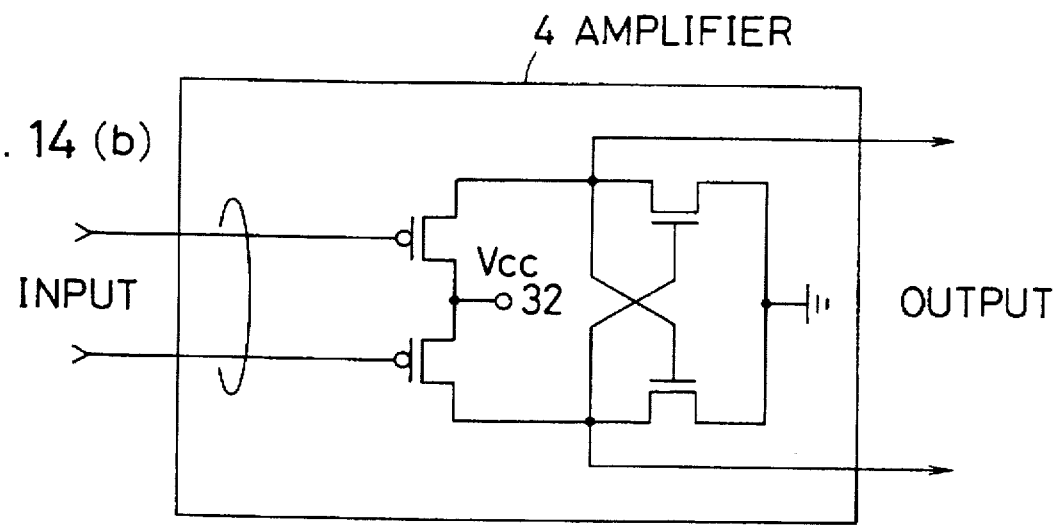
Figure 15:
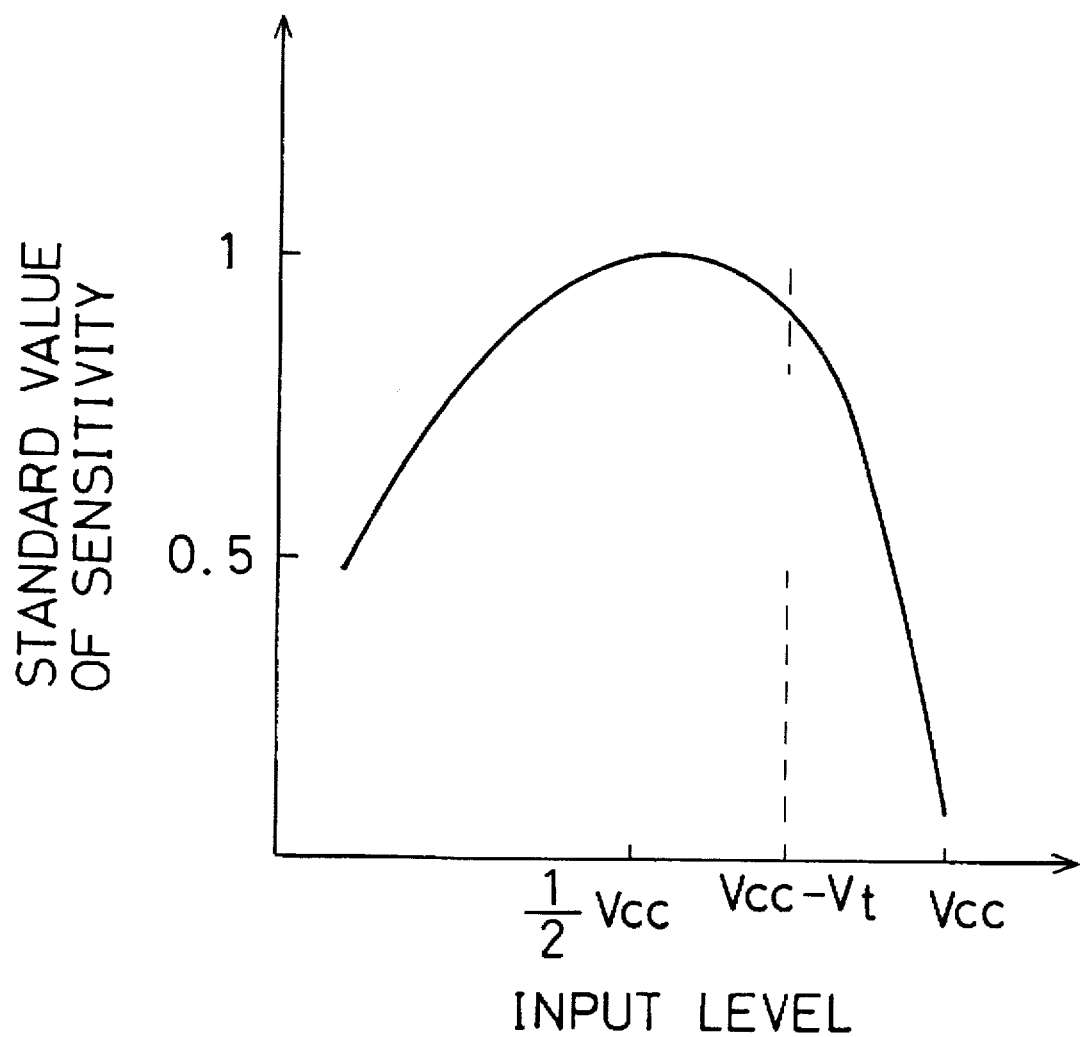
FIG. 15 shows characteristics of sensitivity of the voltage detecting type amplifier with respect to an input level.
Figure 1:
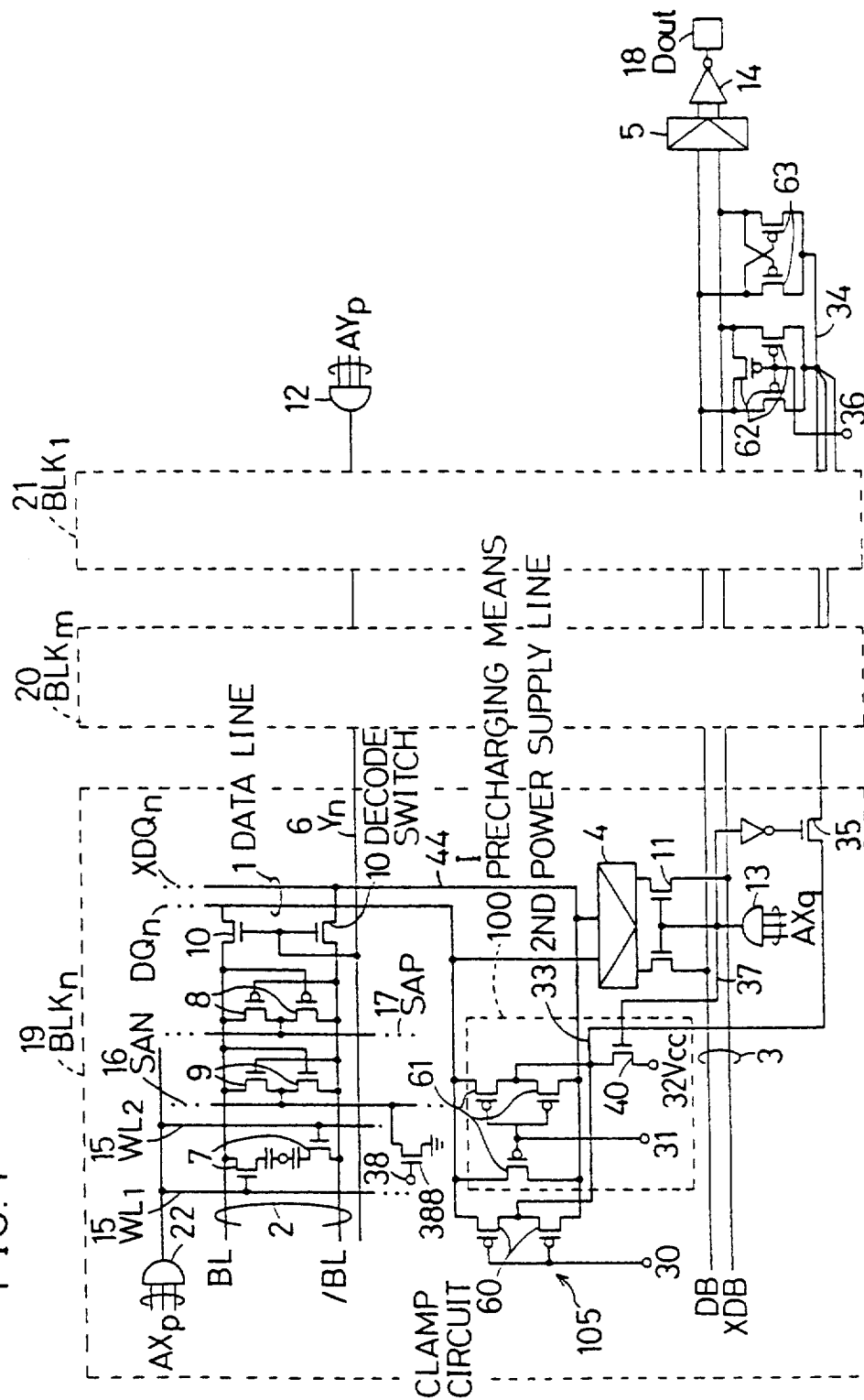
Figure 11:
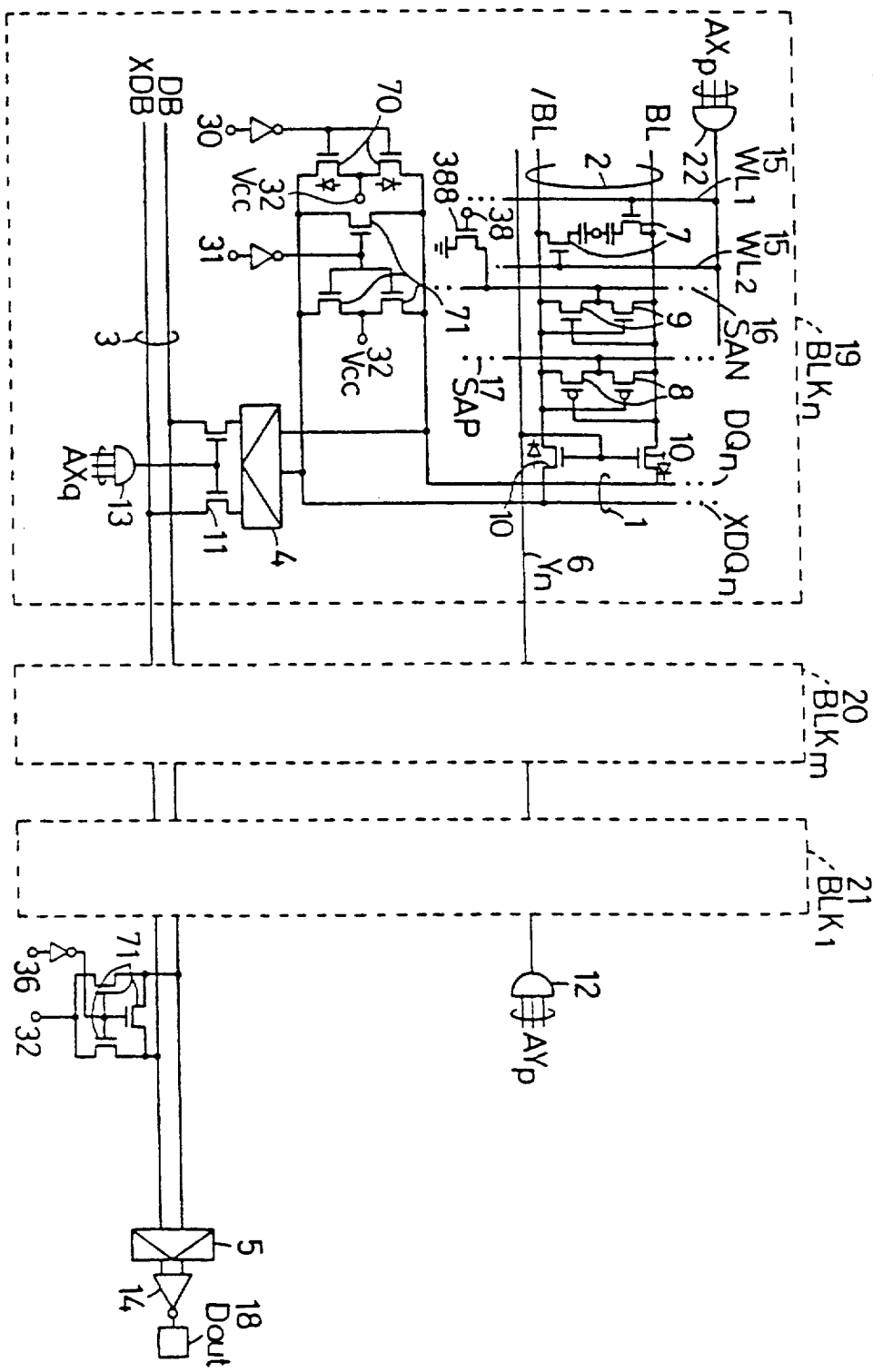
Figure 13:
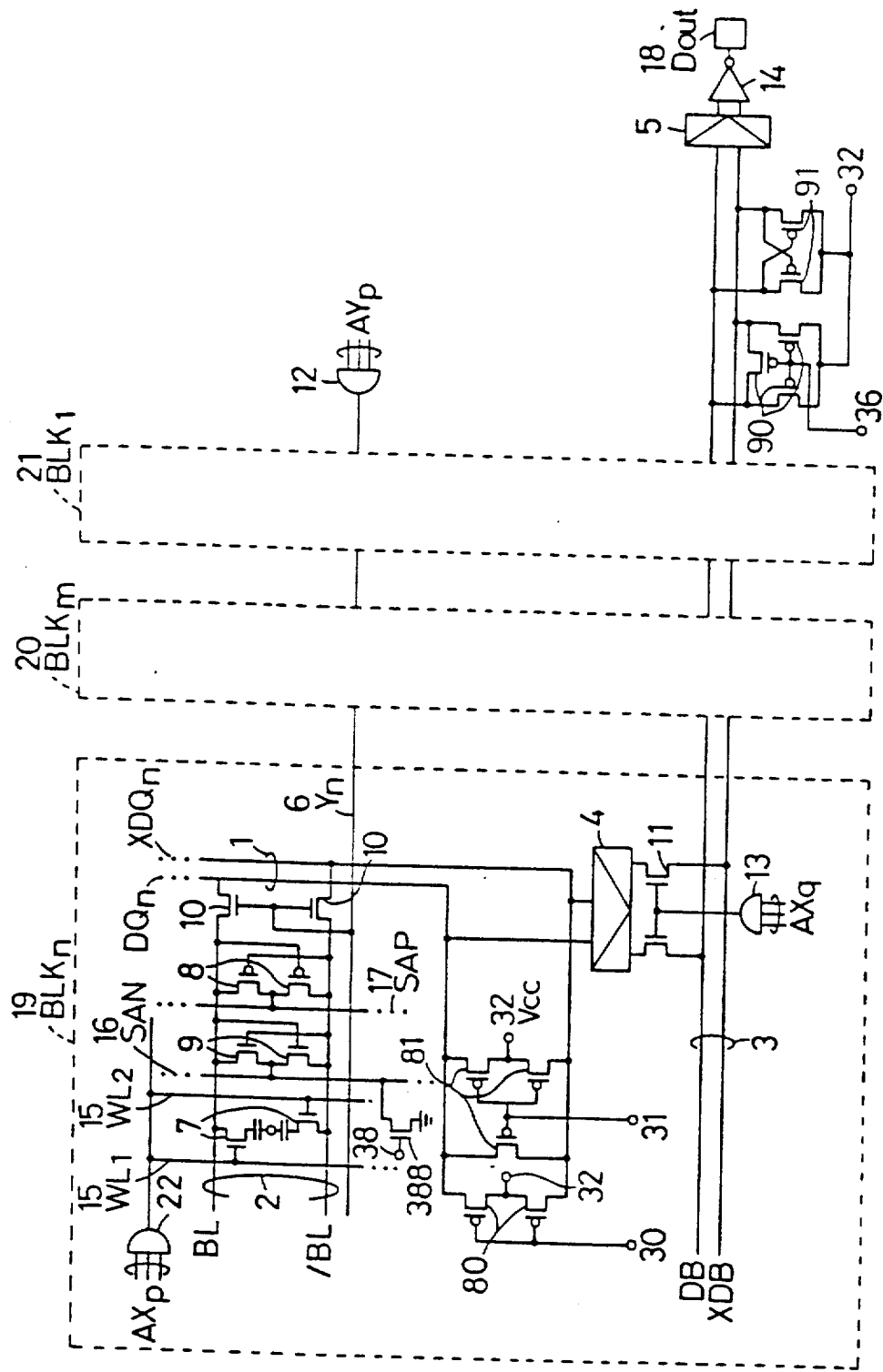

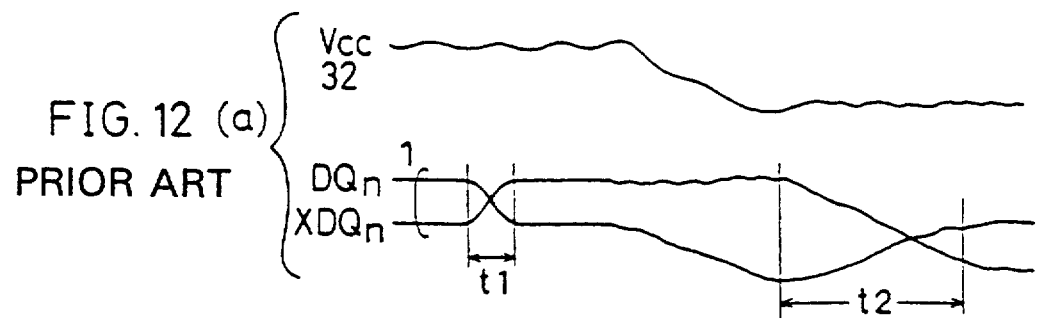
FIG. 12 (a) PRIOR ART
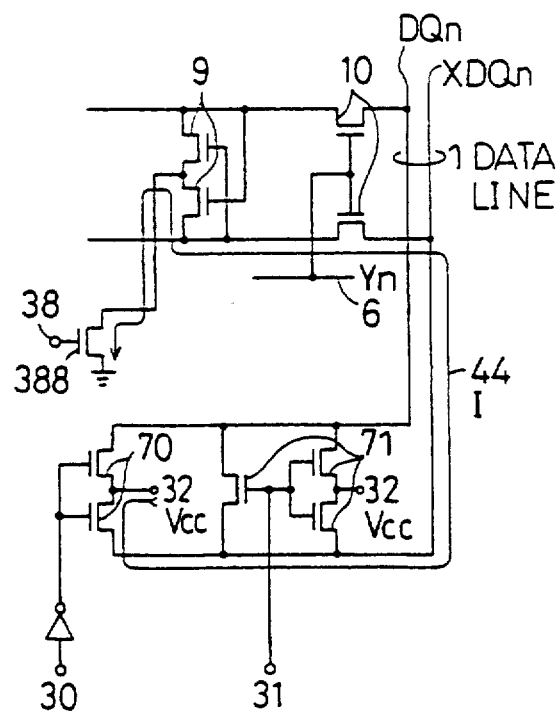
FIG. 12 (b) PRIOR ART